(12) United States Patent
Knotter et al.

(10) Patent No.: US 6,562,254 B2
(45) Date of Patent: May 13, 2003

(54) ETCHING METHOD

(75) Inventors: Dirk M. Knotter, Eindhoven (NL); Antonius A. M. Van De Vorst, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/259,962

(22) Filed: Mar. 1, 1999

(65) Prior Publication Data
US 2002/0100745 A1 Aug. 1, 2002

(30) Foreign Application Priority Data
Mar. 2, 1998 (EP) .......... 98200645

(51) Int. Cl.$^7$ .............. C03C 15/00
(52) U.S. Cl. .......... 216/84; 216/85; 216/86; 438/16; 156/345.15; 156/345.16
(58) Field of Search .......... 216/84, 59, 60, 216/61, 85, 86; 156/345.16, 345.15; 438/16; 117/201

(56) References Cited

U.S. PATENT DOCUMENTS

| | | | |
|---|---|---|---|
| 5,117,192 A | 5/1992 | Hurd | 324/727 |
| 5,282,925 A | 2/1994 | Jeng et al. | 156/646 |
| 5,885,402 A | 3/1999 | Esquibel | 156/345 |
| 5,942,100 A | 8/1999 | Sauerland | 205/641 |

FOREIGN PATENT DOCUMENTS

| | | | |
|---|---|---|---|
| JP | 1175741 | 7/1989 | H01L/21/306 |
| JP | 10092789 A | 4/1998 | |

*Primary Examiner*—Randy Gulakowski
*Assistant Examiner*—M. Kornakov
(74) *Attorney, Agent, or Firm*—Aaron Waxler

(57) ABSTRACT

A method of reducing the thickness t of a layer of material on a substrate when the substrate is exposed to an etchant for a span of time sufficient to reduce t to a value $t_o$, at which point exposure to the etchant is interrupted, includes the thickness to being determined using monitoring means which, at any given instant, allow determination of the depth $\Delta t$ of material which has been etched away. The method further includes the monitoring means being embodied as a resonant crystal whose resonant frequency f at any given instant is a function of the mass m of the crystal at that instant. The crystal is coated with a layer of reference material of thickness d, which material can be etched using the same etchant as for the material on the substrate. The crystal is exposed to the etchant simultaneously with the substrate, thus causing m to decrease as reference material is etched away, a decrease $\Delta m$ in m corresponding to a decrease $\Delta d$ in d, in turn corresponding to a decrease $\Delta t$ in t. The resonant frequency f is monitored so as to identify the increase $\Delta f$ in f corresponding to a decrease $\Delta m$ in m, in turn corresponding to a decrease $\Delta t$ in t, and exposure of both the substrate and the crystal to the etchant is interrupted upon attainment of a frequency $f_o = f + \Delta f$ corresponding to the desired value $t_o = t - \Delta t$.

5 Claims, No Drawings

ETCHING METHOD

The invention relates to a method of reducing the thickness t of a layer of material on a substrate, whereby the substrate is exposed to an etchant for a span of time sufficient to reduce t to a value $t_o$, at which point exposure to the etchant is interrupted.

Such a method is routinely (but not exclusively) employed in the manufacture of semiconductor devices, in which a substrate such as a silicon wafer is coated with a layer of material such as silicon oxide or silicon nitride, which layer is (selectively) etched away so as to create a patterned planar device; repetitive stacked deposition and etching of layers in this manner then allows the creation of an entire integrated circuit. Depending inter alia on the material to be etched, on the composition of the substrate, and on the required etching profile, the employed etchant may, for example, be a liquid (such as aqueous HF) or a plasma (as in Reactive Ion Etching). Since the exact (microscopic) dimensions and accuracy of overlap of the various etched features can be critical to the satisfactory performance of the final product, it is often essential to be able to conduct the etching procedure with great accuracy. In particular, it is necessary to be able to etch exactly to pre-determined depths.

A method as described in the opening paragraph can take various forms. One approach is to calculate or measure the etch rate R of the etchant for the material to be etched, and then limit the duration T of the substrate's exposure to the etchant according to the formula:

$$T=(t-t_o)/R.$$

However, such an approach is fraught with problems, since R is generally not a constant function of time. In particular, R can vary as a function of temperature and pH of the etchant, the former being a variable, for example, in the case of an exoergic etch reaction and the latter undergoing variations, for example, as a result of evaporation and reactant depletion. As a countermeasure, one can attempt to continually monitor and correct the concentration of the etchant by monitoring its electrical conductivity. However, if the etching process releases ionic etch products, then these can influence the measured electrical conductivity, which is then no longer directly related to the etchant concentration.

It is an object of the invention to alleviate these problems. In particular, it is an object of the invention to provide a method as specified in the opening paragraph, which method allows highly accurate determination of the thickness of material removed from the substrate at any given instant. Specifically, it is an object of the invention that this method should not require measurement of the electrical conductivity of the etchant. Moreover, it is an object of the invention that the accuracy of the said method should be substantially independent of fluctuations in the temperature or pH of the etchant.

These and other objects are achieved according to the invention in a method as stated in the opening paragraph, characterized in that:
the thickness $t_o$ is determined using monitoring means which, at any given instant, allow determination of the depth $\Delta t$ of material which has been etched away;
the monitoring means are embodied as a resonant crystal whose resonant frequency f at any given instant is a function of the mass m of the crystal at that instant;
the crystal is coated with a layer of reference material of thickness d, which material can be etched using the same etchant as for the material on the substrate;
the crystal is exposed to the etchant simultaneously with the substrate, thus causing m to decrease as reference material is etched away, a decrease $\Delta m$ in m corresponding to a decrease $\Delta d$ in d, in turn corresponding to a decrease $\Delta t$ in t;
the resonant frequency f is monitored so as to identify the increase $\Delta f$ in f corresponding to a decrease $\Delta m$ in m, in turn corresponding to a decrease $\Delta t$ in t;
exposure of both the substrate and the crystal to the etchant is interrupted upon attainment of a frequency $f_o=f+\Delta f$ corresponding to the desired value $t_o=t-\Delta t$.

The improved etch accuracy which can be achieved with the method according to the invention is attributable to the fact that it provides a direct monitor of the etching operation (via the reduction in t) rather than an indirect observation (via a calculation of the etchant concentration). Thus, regardless of any change in etch rate which may result, for example, from temperature variations or pH changes, the method according to the invention allows the actual etch result to be accurately monitored, by directly tracking t as a function of time. This is the case whether the method is used in conjunction with a wet or dry etchant (e.g. a liquid etchant bath, a spray-processing operation or a sputter-etch procedure).

In a particular embodiment of the method according to the invention, the reference material on the resonant crystal is the same as the material in the layer on the substrate, e.g. both layers are comprised of silicon dioxide. This is not a strict requirement, however: if desired, the reference material and the material to be thinned on the substrate may be disparate, as long as they can both be etched by the given etchant. However, in this latter case, it will be necessary to perform a calibration experiment or calculation, so as to determine the relative rates at which the two different materials are etched under identical conditions; this then allows a given value of $\Delta d$ to be translated into a corresponding value of $\Delta t$.

Another embodiment of the method according to the invention is characterized in that the resonant crystal is a quartz crystal. So-called quartz crystal microbalances are commercially available, and are frequently employed in deposition chambers (such as sputter-deposition or MBE chambers) to help calibrate and determine the thicknesses of layers of material deposited in such chambers.

A particular embodiment of the method according to the invention is characterized in that the etchant is a liquid. For example, a dilute HF solution can be employed to remove a thin layer of natural silicon oxide from a silicon wafer substrate. Using the method according to the invention to closely monitor this process and to accurately interrupt etching as soon as $t=t_o\approx 0$, one can ensure that only a minimal surfacial film is removed from artificial silicon oxide structures located elsewhere on the substrate. The employed liquid etchant may be located in a bath into which the substrate is dipped (immersed), or the substrate may be exposed to a liquid/vapor spray, as in so-called spray processing.

The invention is not only embodied in the method described in claim 1, but can also be performed in an alternative manner. In this respect, the invention relates to a method of determining the etch rate of an etchant with respect to a given test material, characterized in that:
use is made of a resonant crystal whose resonant frequency f at any given instant is a function of the mass m of the crystal at that instant;
the crystal is coated with a layer of test material of thickness d;

the crystal is exposed to the etchant for a span of time T, thus causing m to decrease as test material is etched away from the crystal, a decrease $\Delta m$ in m corresponding to a decrease $\Delta d$ in d;

the resonant frequency f is monitored so as to identify the increase $\Delta f$ in f corresponding to a decrease $\Delta m$ in m, in turn corresponding to a decrease $\Delta d$ in d;

the etch rate $\Delta d/T$ is derived from the ratio $\Delta f/T$.

In this aspect of the invention, the resonant crystal is not exposed to the etchant at the same time as a substrate to be treated by that etchant. Instead, the etch rate R of the etchant (with respect to the material to be thinned on the substrate) is determined at another point in time, for example:

the resonant crystal may be immersed in a bath of liquid etchant prior to immersion of the substrate, so as to accurately determine R and, thus, predetermine the exposure time T required to achieve a layer thinning $\Delta t$. If T is relatively short, then R may remain substantially constant during exposure, so that this approach can give satisfactorily accurate results;

the resonant crystal can be placed "downstream" in a spray processor; by analogy (and for purposes of illustrative clarification only), this is roughly equivalent to testing shower water as it passes out of a bath tub, and then using the results to regulate the properties of the stream of water emerging from the shower head in that bath tub. In this case, a flow of etchant is monitored after it has made contact with a substrate to be treated, and a feedback process is used to adapt the properties (e.g. concentration) of a supply of etchant which has yet to come into contact with a substrate to be treated.

What is claimed is:

1. A method of reducing a thickness t of a layer of material on a substrate, whereby the substrate is continuously exposed to a liquid or gaseous etchant for a span of time sufficient to reduce t to a value to, at which point exposure to the etchant is interrupted, comprising:

determining the thickness to using a direct monitoring means which, at any given instant, allows for determination of a depth $\Delta t$ of material which has been etched away without calculating an etchant concentration that requires factoring in any change of temperature variations or pH changes of the etchant;

embodying the monitoring means as a resonant crystal whose resonant frequency f at any given instant is a function of a mass m of the crystal at that instant;

coating the crystal with a layer of reference material of thickness d, which material can be etched using the same etchant as for the material on the substrate;

exposing the crystal to the etchant simultaneously with the substrate in an etch bath or as a liquid/vapor spray, thus causing m to decrease as reference material is etched away, a decrease $\Delta m$ in m corresponding to a decrease $\Delta d$ in d, in turn corresponding to a decrease $\Delta t$ in t;

monitoring the resonant frequency f so as to identify the increase $\Delta f$ in f corresponding to a decrease $\Delta m$ in m, in turn corresponding to a decrease $\Delta t$ in t; and accurately interrupting the exposure of both the substrate and the crystal to the etchant upon attainment of a frequency $f_o=f+\Delta f$ corresponding to the desired value $t_o=t-\Delta t$, substantially independently of fluctuations in temperature or pH of the etchant.

2. A method according to claim 1, wherein the reference material is the same as the material on the substrate.

3. A method according to claim 1, wherein the crystal is a quartz crystal.

4. A method according to claim 1, wherein the material on the substrate is silicon oxide and that the etchant comprises aqueous hydrogen fluoride.

5. A method according to claim 1, wherein $t_o=0$.

* * * * *